United States Patent
Lin et al.

(10) Patent No.: US 12,213,388 B2
(45) Date of Patent: *Jan. 28, 2025

(54) MEMORY CELL, INTEGRATED CIRCUIT, AND MANUFACTURING METHOD OF MEMORY CELL

(71) Applicant: Taiwan Semiconductor Manufacturing Company, Ltd., Hsinchu (TW)

(72) Inventors: Yu-Chao Lin, Hsinchu (TW); Tung-Ying Lee, Hsinchu (TW); Da-Ching Chiou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/472,161

(22) Filed: Sep. 21, 2023

(65) Prior Publication Data
US 2024/0016070 A1 Jan. 11, 2024

Related U.S. Application Data

(63) Continuation of application No. 17/407,105, filed on Aug. 19, 2021, now Pat. No. 11,825,753.

(51) Int. Cl.
*H01L 21/768* (2006.01)
*H10B 63/00* (2023.01)
*H10N 70/00* (2023.01)

(52) U.S. Cl.
CPC ...... *H10N 70/023* (2023.02); *H01L 21/76831* (2013.01); *H01L 21/76832* (2013.01); *H10B 63/30* (2023.02); *H10N 70/063* (2023.02); *H10N 70/066* (2023.02); *H10N 70/068* (2023.02); *H10N 70/841* (2023.02); *H10N 70/882* (2023.02)

(58) Field of Classification Search
CPC .. H10N 70/023; H10N 70/063; H10N 70/066; H10N 70/068; H10N 70/841; H10N 70/882; H01L 21/76831; H01L 21/76832; H10B 63/30
USPC .................................................. 365/148, 158
See application file for complete search history.

(56) References Cited

U.S. PATENT DOCUMENTS

| | | | | |
|---|---|---|---|---|
| 9,553,265 B1 * | 1/2017 | Yang | ..................... | H10N 70/821 |
| 11,107,986 B2 * | 8/2021 | Hung | ..................... | H10B 63/30 |
| 11,342,382 B1 * | 5/2022 | Tortorelli | ............. | H10N 70/231 |
| 2008/0291718 A1 * | 11/2008 | Liu | ........................ | H10N 70/884 |
| | | | | 438/102 |
| 2013/0001502 A1 * | 1/2013 | Jung | ..................... | H10N 70/231 |
| | | | | 257/4 |
| 2018/0226452 A1 * | 8/2018 | Nam | ..................... | G11C 11/165 |
| 2019/0148638 A1 * | 5/2019 | Sung | ................... | H10N 70/8833 |
| | | | | 257/4 |

(Continued)

*Primary Examiner* — Michael T Tran
(74) *Attorney, Agent, or Firm* — JCIPRNET

(57) ABSTRACT

A memory cell includes a bottom electrode, a first dielectric layer, a top electrode, and a variable resistance layer. The first dielectric layer laterally surrounds the bottom electrode. The top electrode is disposed over the bottom electrode and the first dielectric layer. The variable resistance layer is sandwiched between the bottom electrode and the top electrode and between the first dielectric layer and the top electrode. The variable resistance layer exhibits a T-shape in a cross-sectional view.

20 Claims, 14 Drawing Sheets

(56) References Cited

U.S. PATENT DOCUMENTS

| | | | | |
|---|---|---|---|---|
| 2020/0335353 A1* | 10/2020 | Chen | .................... | H01L 23/528 |
| 2021/0057643 A1* | 2/2021 | Chou | .................... | H10N 70/826 |
| 2021/0217813 A1* | 7/2021 | Wang | .................... | H10N 70/063 |
| 2022/0037399 A1* | 2/2022 | Lin | ....................... | H10N 70/068 |
| 2022/0093858 A1* | 3/2022 | Hsu | ....................... | H10B 63/00 |
| 2022/0336740 A1* | 10/2022 | Kong | ................... | H10N 70/011 |
| 2022/0407006 A1* | 12/2022 | Zhou | .................... | H10N 70/24 |
| 2022/0416157 A1* | 12/2022 | Cheng | .................. | H10N 70/826 |
| 2023/0050843 A1* | 2/2023 | Xiao | ....................... | H10B 63/30 |
| 2023/0187274 A1* | 6/2023 | Patlolla | ............... | H01L 23/5226 |
| | | | | 257/774 |

* cited by examiner

MEMORY CELL, INTEGRATED CIRCUIT, AND MANUFACTURING METHOD OF MEMORY CELL

CROSS-REFERENCE TO RELATED APPLICATION

This application is a continuation application of and claims the priority benefit of a prior application Ser. No. 17/407,105, filed on Aug. 19, 2021, now patented as U.S. Pat. No. 11,825,753 B2. The entirety of the above-mentioned patent application is hereby incorporated by reference herein and made a part of this specification.

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a PCM is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
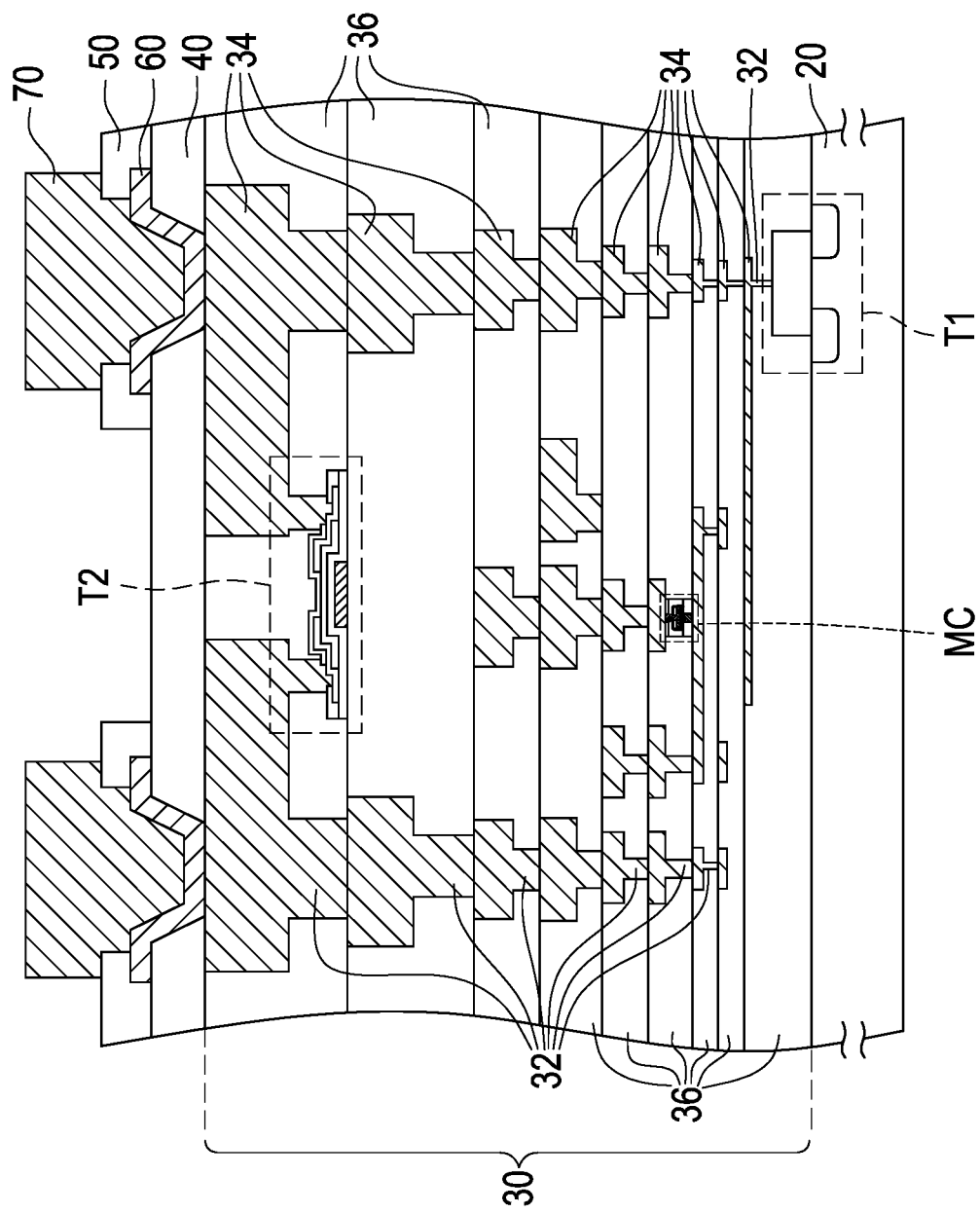
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of an integrated circuit IC in accordance with some embodiments of the disclosure. In some embodiments, the integrated circuit IC includes a substrate 20, an interconnect structure 30, a passivation layer 40, a post-passivation layer 50, a plurality of conductive pads 60, and a plurality of conductive terminals 70. In some embodiments, the substrate 20 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 20 may be a bulk silicon substrate, a silicon-on-insulator (SOI) substrate, or a germanium-on-insulator (GOI) substrate.

In some embodiments, the substrate 20 includes various doped regions depending on circuit requirements (e.g., p-type semiconductor substrate or n-type semiconductor substrate). In some embodiments, the doped regions are doped with p-type or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a first transistor T1, which is over the substrate 20. Depending on the types of the dopants in the doped regions, the first transistor T1 may be referred to as n-type transistor or p-type transistor. In some embodiments, the first transistor T1 further includes a metal gate and a channel under the metal gate. The channel is located between the source region and the drain region to serve as a path for electron to travel when the first transistor T1 is turned on. On the other hand, the metal gate is located above the substrate 20 and is embedded in the interconnect structure 30. In some embodiments, the first transistor T1 is formed using suitable Front-end-of-line (FEOL) process. For simplicity, one first transistor T1 is shown in FIG. 1. However, it should be understood that more than one first transistors T1 may be presented depending on the application of the integrated circuit IC. When multiple first transistors T1 are presented, these first transistors T1 may be separated by shallow trench isolation (STI; not shown) located between two adjacent first transistors T1.

As illustrated in FIG. 1, the interconnect structure 30 is disposed on the substrate 20. In some embodiments, the interconnect structure 30 includes a plurality of conductive vias 32, a plurality of conductive patterns 34, a plurality of dielectric layers 36, a memory cell MC, and a second transistor T2. As illustrated in FIG. 1, the conductive patterns 34 and the conductive vias 32 are embedded in the dielectric layers 36. In some embodiments, the conductive patterns 34 located at different level heights are connected to one another through the conductive vias 32. In other words, the conductive patterns 34 are electrically connected to one another through the conductive vias 32. In some embodiments, the bottommost conductive vias 32 are connected to the first transistor T1. For example, the bottommost conductive vias 32 are connected to the metal gate, which is embedded in the bottommost dielectric layer 36, of the first transistor T1. In other words, the bottommost conductive vias 32 establish electrical connection between the first transistor T1 and the conductive patterns 34 of the interconnect structure 30. As illustrated in FIG. 1, the bottommost conductive via 32 is connected to the metal gate of the first transistor T1. It should be noted that in some alternative cross-sectional views, other bottommost conductive vias 32 are also connected to source/drain regions of the first transistor T1. That is, in some embodiments, the bottommost conductive vias 32 may be referred to as "contact structures" of the first transistor T1.

In some embodiments, a material of the dielectric layers 36 includes polyimide, epoxy resin, acrylic resin, phenol resin, benzocyclobutene (BCB), polybenzoxazole (PBO), or any other suitable polymer-based dielectric material. Alternatively, the dielectric layers 36 may be formed of oxides or nitrides, such as silicon oxide, silicon nitride, or the like. The dielectric layers 36 may be formed by suitable fabrication techniques such as spin-on coating, chemical vapor deposition (CVD), plasma-enhanced chemical vapor deposition (PECVD), or the like.

In some embodiments, a material of the conductive patterns 34 and the conductive vias 32 includes aluminum, titanium, copper, nickel, tungsten, or alloys thereof. The conductive patterns 34 and the conductive vias 32 may be formed by electroplating, deposition, and/or photolithography and etching. In some embodiments, the conductive patterns 34 and the underlying conductive vias 32 are formed simultaneously. It should be noted that the number of the dielectric layers 36, the number of the conductive patterns 34, and the number of the conductive vias 32 illustrated in FIG. 1 are merely for illustrative purposes, and the disclosure is not limited thereto. In some alternative embodiments, fewer or more layers of the dielectric layers 36, the conductive patterns 34, and/or the conductive vias 32 may be formed depending on the circuit design.

As illustrated in FIG. 1, the memory cell MC is embedded in the interconnection structure 30. For example, the memory cell MC is embedded in one of the dielectric layers 36. For simplicity, one memory cell MC is shown in FIG. 1. However, it should be understood that more than one memory cells MC may be presented depending on the application of the integrated circuit IC. The formation method and the structure of the memory cell MC will be described in detail later.

In some embodiments, the second transistor T2 is also embedded in the interconnection structure 30. For example, the second transistor T2 is embedded in one of the dielectric layer 36. For simplicity, one second transistor T2 is shown in FIG. 1. However, it should be understood that more than one second transistors T2 may be presented depending on the application of the integrated circuit IC. In some embodiments, the second transistor T2 is electrically connected to the conductive patterns 34 through the corresponding conductive vias 32. In some embodiments, the second transistor T2 is a thin-film transistors (TFT). For example, the second transistor T2 includes a gate electrode, a gate dielectric layer, a channel layer, and source/drain regions. The gate dielectric layer is sandwiched between the channel layer and the gate electrode. The source/drain regions are respective disposed at two opposite ends of the channel layer. As illustrated in FIG. 1, the conductive vias 32 are in physical contact with the source/drain regions to render electrical connection with the second transistor T2. It should be noted that in some alternative cross-sectional views, another conductive via 32 is also connected to gate electrode of the second transistor T2. In some embodiments, the second transistor T2 is electrically connected to the memory cell MC. In some embodiments, the second transistor T2 and the memory cell MC may be collectively referred to as a memory device. For example, the second transistor T2 may serve as a selector for the memory device. As will be described later, since the memory cell MC includes phase change materials, the memory device illustrated in FIG. 1 may be referred to as Phase Change Random Access Memory (PCRAM) device. In some embodiments, since the second transistor T2 and the memory cell MC are embedded in the interconnection structure 30, the second transistor T2 and the memory cell MC are being considered as formed during back-end-of-line (BEOL) process. It should be noted that although FIG. 1 illustrated that the second transistor T2 and the memory cell MC are being embedded in different dielectric layers 36, the disclosure is not limited thereto. In some alternative embodiments, the second transistor T2 and the memory cell MC are embedded in the same dielectric layer 36.

As illustrated in FIG. 1, the passivation layer 40, the conductive pads 60, the post-passivation layer 50, and the conductive terminals 70 are sequentially formed on the interconnect structure 30. In some embodiments, the passivation layer 40 is disposed on the topmost dielectric layer 36 and the topmost conductive patterns 34. In some embodiments, the passivation layer 40 has a plurality of openings partially exposing each topmost conductive pattern 34. In some embodiments, the passivation layer 40 is a silicon oxide layer, a silicon nitride layer, a silicon oxy-nitride layer, or a dielectric layer formed by other suitable dielectric materials. The passivation layer 40 may be formed by suitable fabrication techniques such as high-density-plasma chemical vapor deposition (HDP-CVD), PECVD, or the like.

In some embodiments, the conductive pads 60 are formed over the passivation layer 40. In some embodiments, the conductive pads 60 extend into the openings of the passivation layer 40 to be in physical contact with the topmost conductive patterns 34. That is, the conductive pads 60 are electrically connected to the interconnect structure 30. In some embodiments, the conductive pads 60 include aluminum pads, copper pads, titanium pads, nickel pads, tungsten pads, or other suitable metal pads. The conductive pads 60 may be formed by, for example, electroplating, deposition, and/or photolithography and etching. It should be noted that the number and the shape of the conductive pads 60 illustrated in FIG. 1 are merely for illustrative purposes, and the disclosure is not limited thereto. In some alternative embodiments, the number and the shape of the conductive pads 60 may be adjusted based on demand.

In some embodiments, the post-passivation layer 50 is formed over the passivation layer 40 and the conductive pads 60. In some embodiments, the post-passivation layer 50 is formed on the conductive pads 60 to protect the conductive pads 60. In some embodiments, the post-passivation layer 50 has a plurality of contact openings partially exposing each conductive pad 60. The post-passivation layer 50 may be a polyimide layer, a PBO layer, or a dielectric layer formed by other suitable polymers. In some embodiments, the post-passivation layer 50 is formed by suitable fabrication techniques such as HDP-CVD, PECVD, or the like.

As illustrated in FIG. 1, the conductive terminals 70 are formed over the post-passivation layer 50 and the conductive pads 60. In some embodiments, the conductive terminals 70 extend into the contact openings of the post-passivation layer 50 to be in physical contact with the corresponding conductive pad 60. That is, the conductive terminals 70 are electrically connected to the interconnect structure 30 through the conductive pads 60. In some embodiments, the conductive terminals 70 are conductive pillars, conductive posts, conductive balls, conductive bumps, or the like. In some embodiments, a material of the conductive terminals 70 includes a variety of metals, metal alloys, or metals and mixture of other materials. For example, the conductive terminals 70 may be made of aluminum, titanium, copper, nickel, tungsten, tin, and/or alloys thereof. The conductive terminals 70 are formed by, for example, deposition, electroplating, screen printing, or other suitable methods. In some embodiments, the conductive terminals 70 are used to establish electrical connection with other components (not shown) subsequently formed or provided.

As mentioned above, the memory cell MC is embedded in the interconnection structure 30. The formation method and the structure of the memory cell MC will be described below in conjunction with FIG. 2A to FIG. 2P.

Figure 2A:
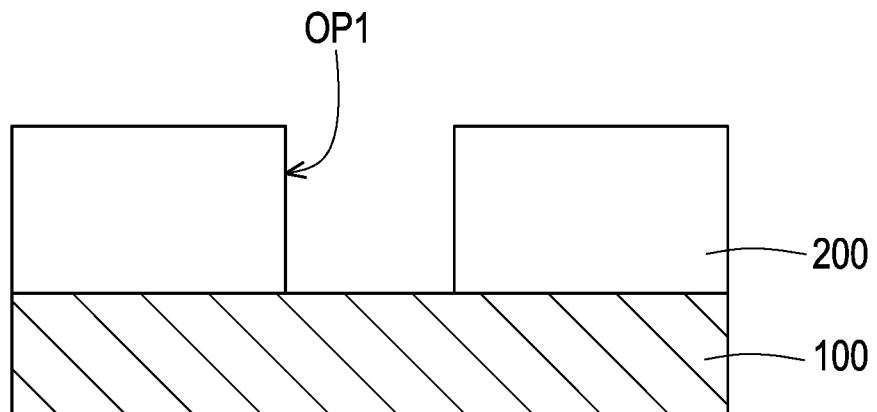
FIG. 2A to FIG. 2P are schematic cross-sectional views illustrating various stages of a manufacturing method of the memory cell in FIG. 1.
Figure 2B:
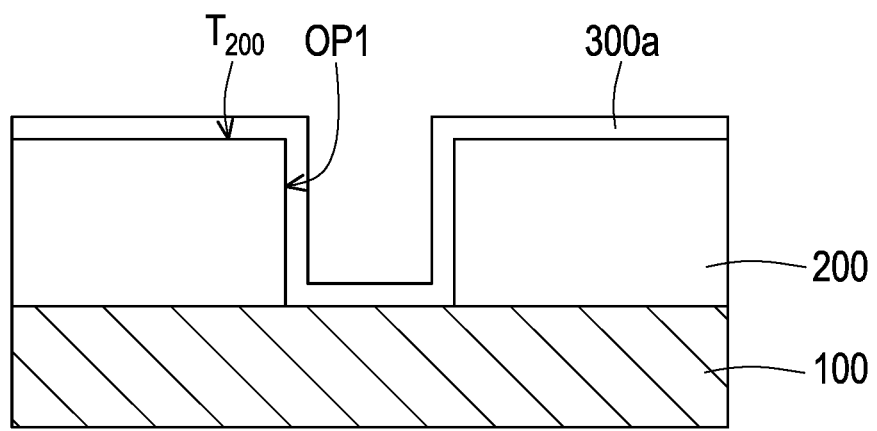
Figure 2C:
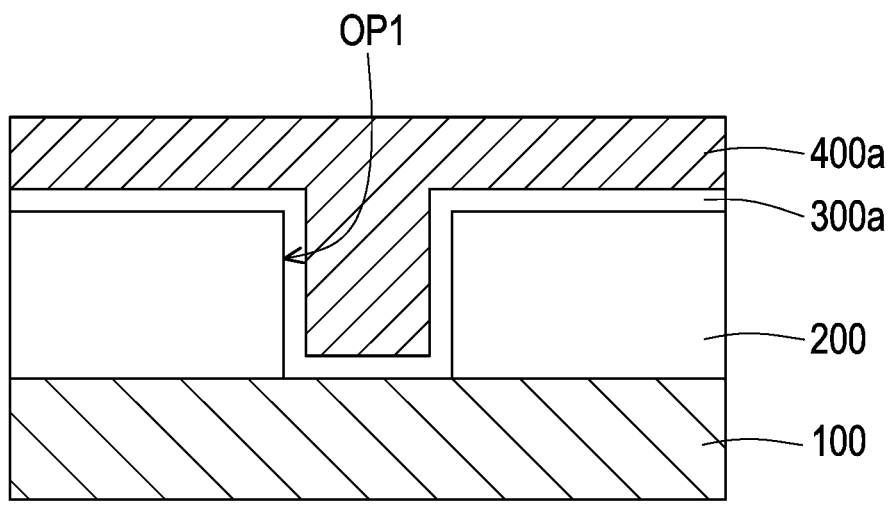
Figure 2D:
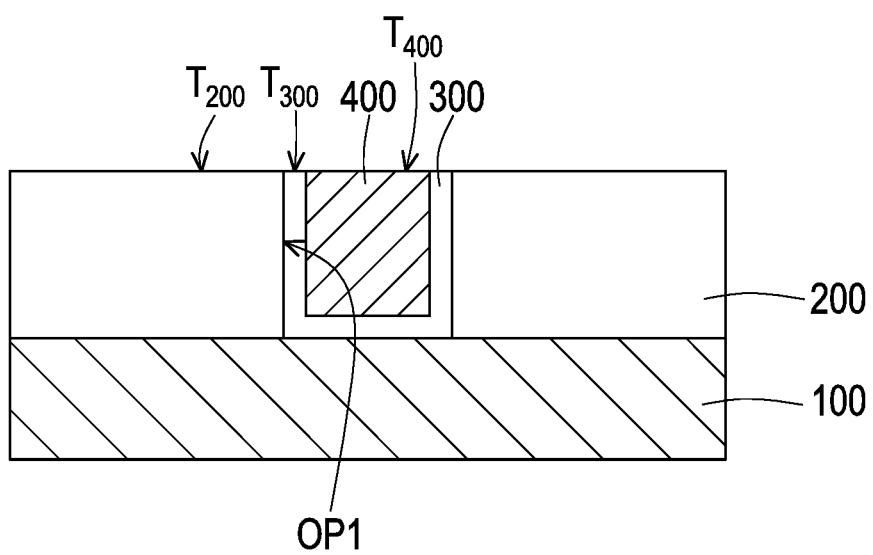
Figure 2E:
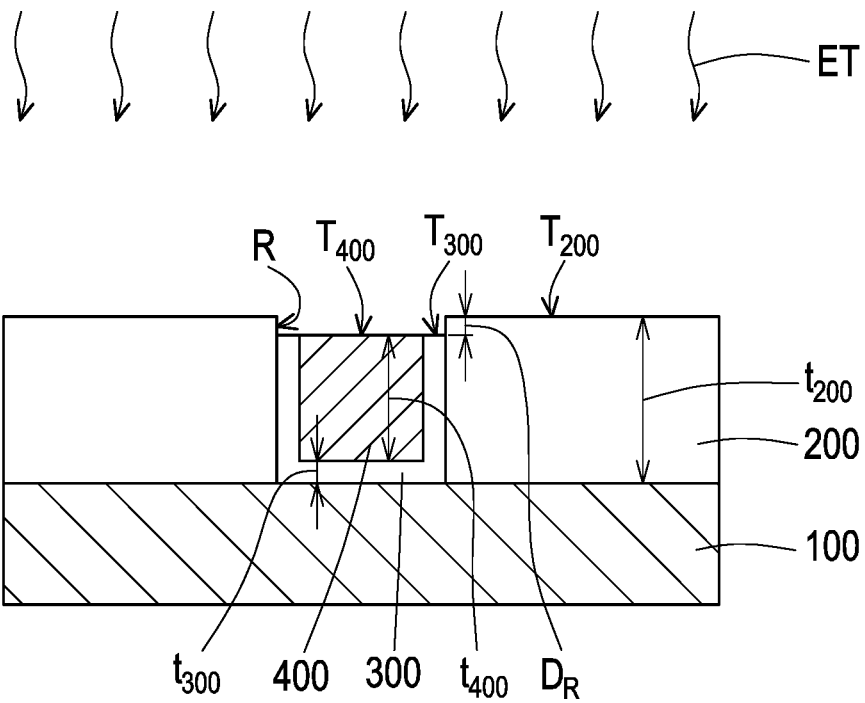
Figure 2F:
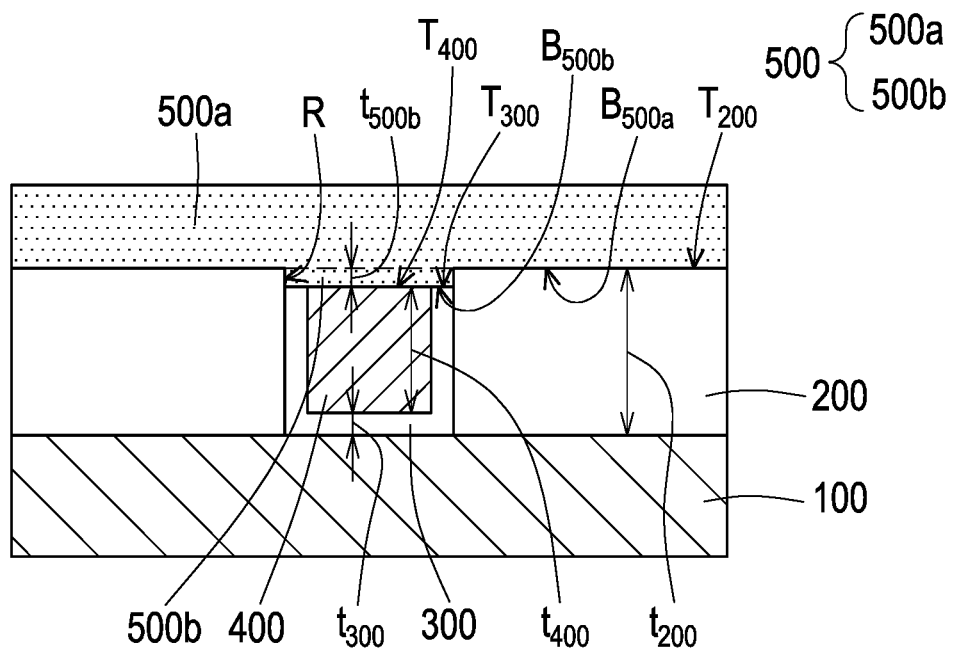
Figure 2G:
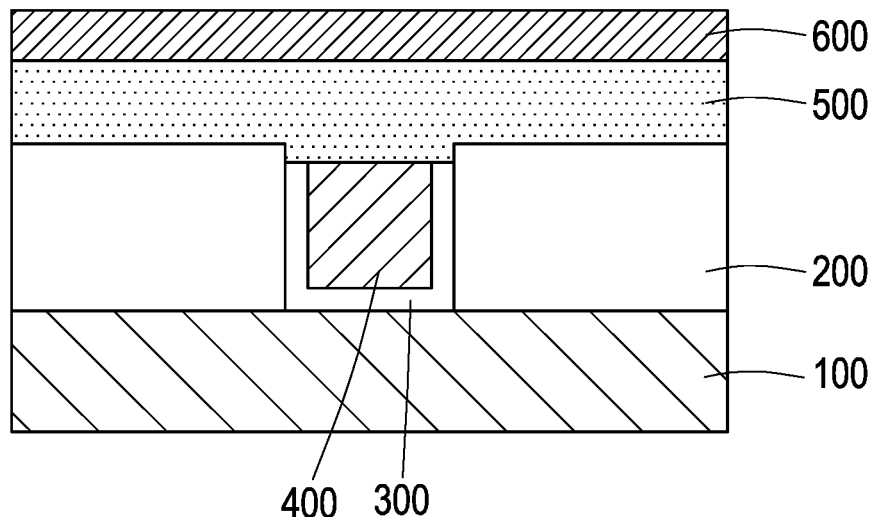
Figure 2H:
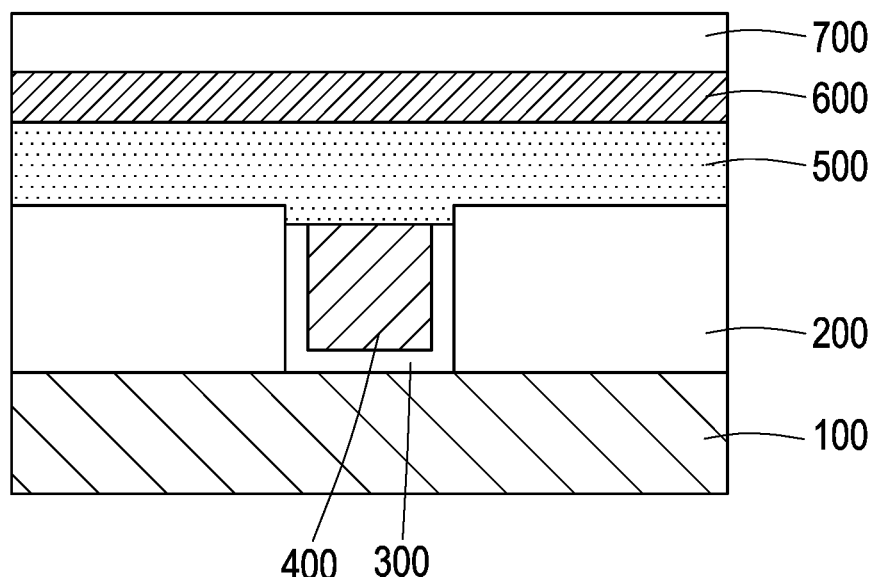
Figure 2I:
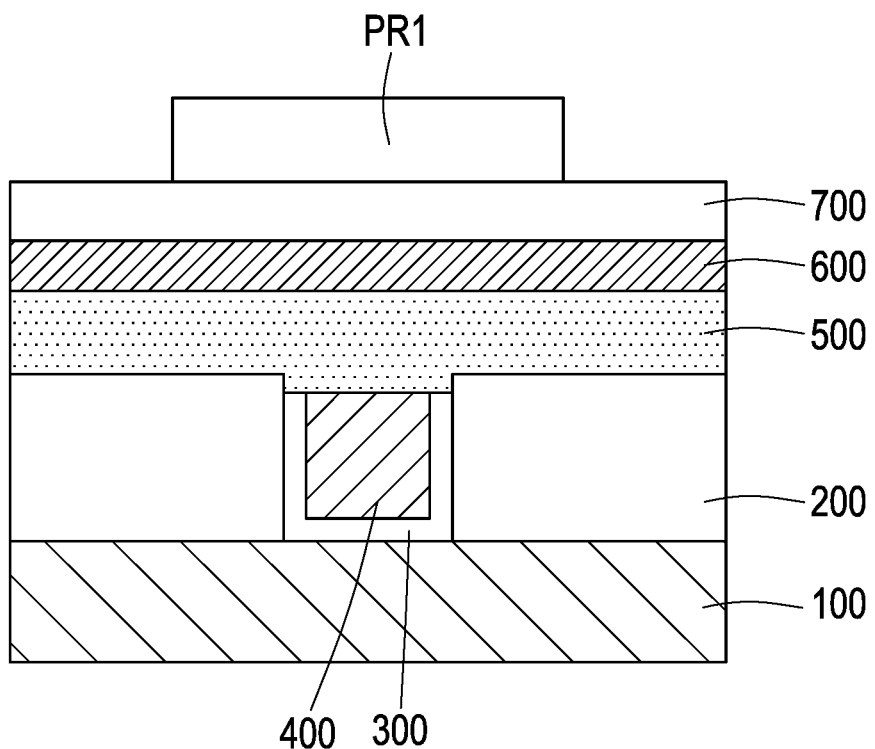
Figure 2J:
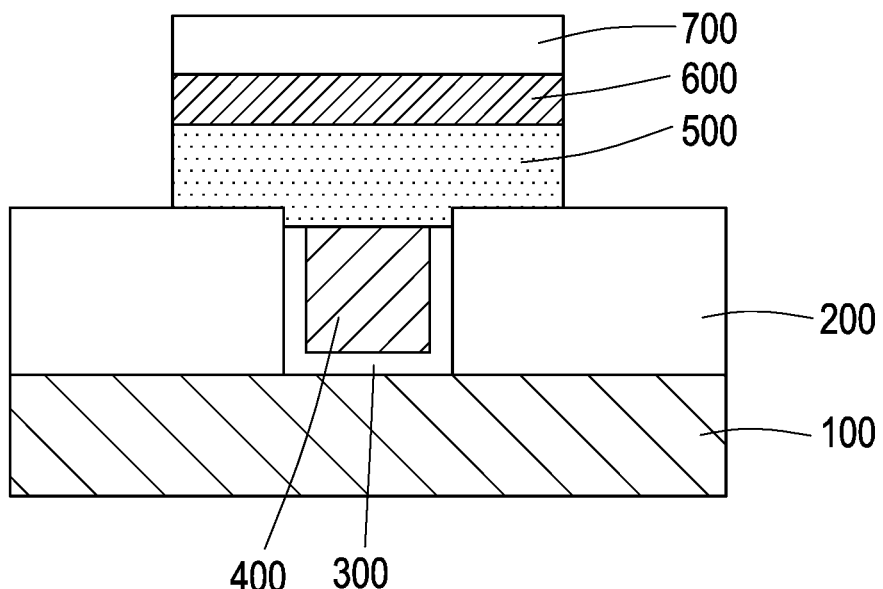
Figure 2K:
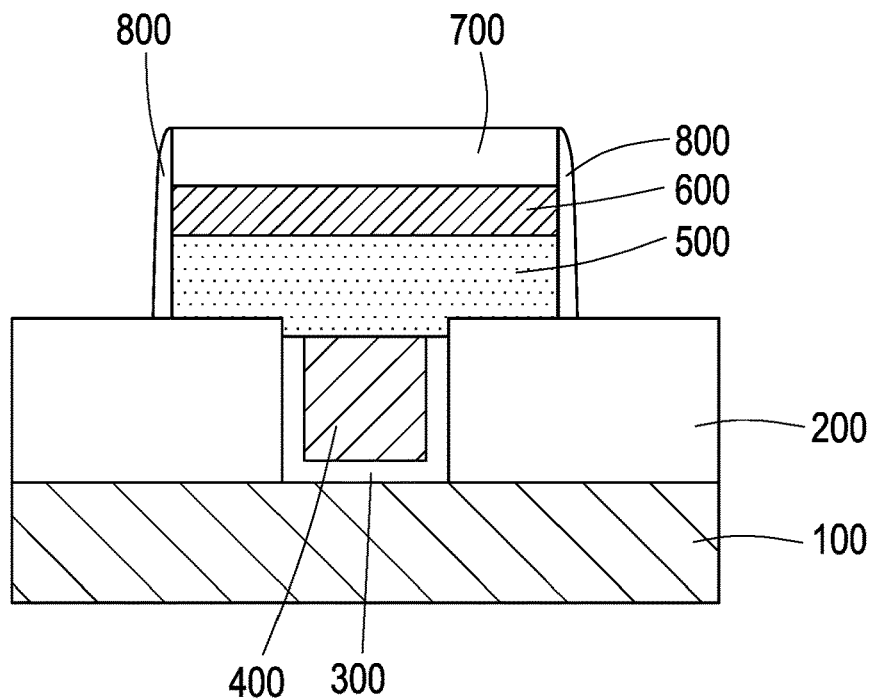
Figure 2L:
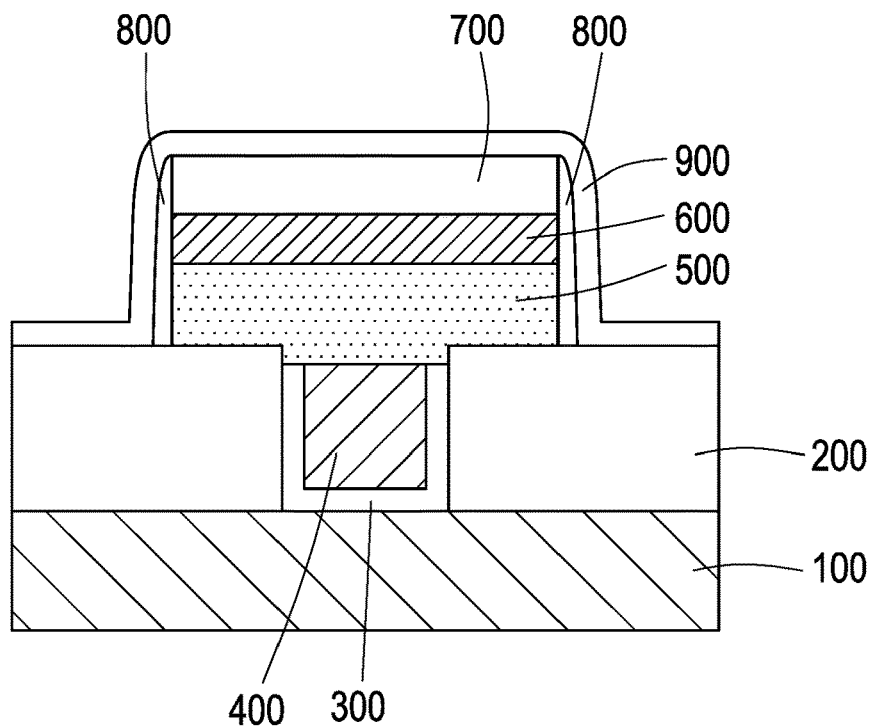
Figure 2M:
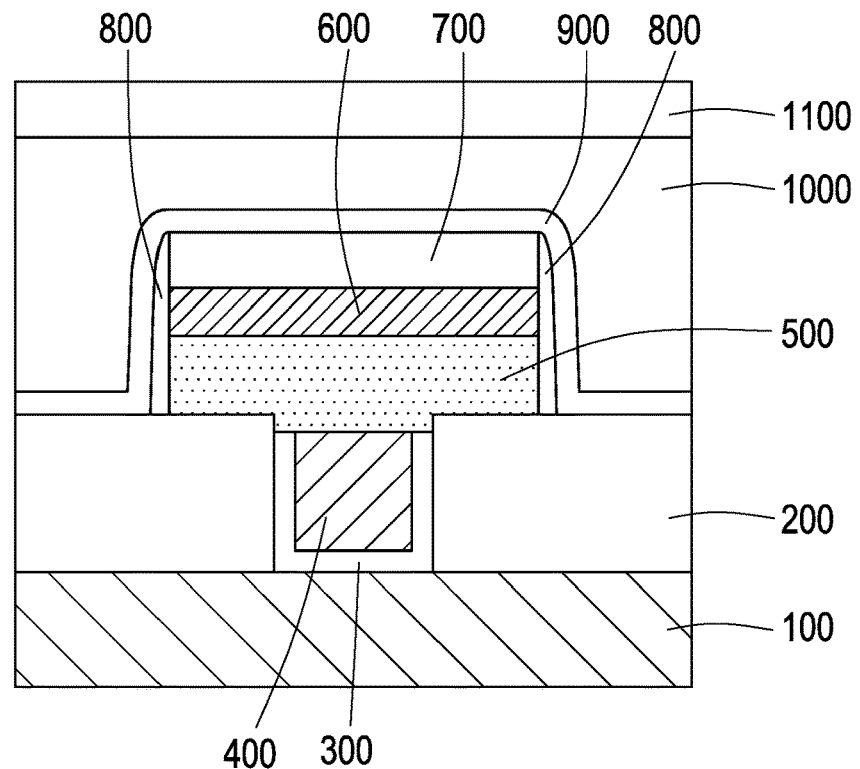
Figure 2N:
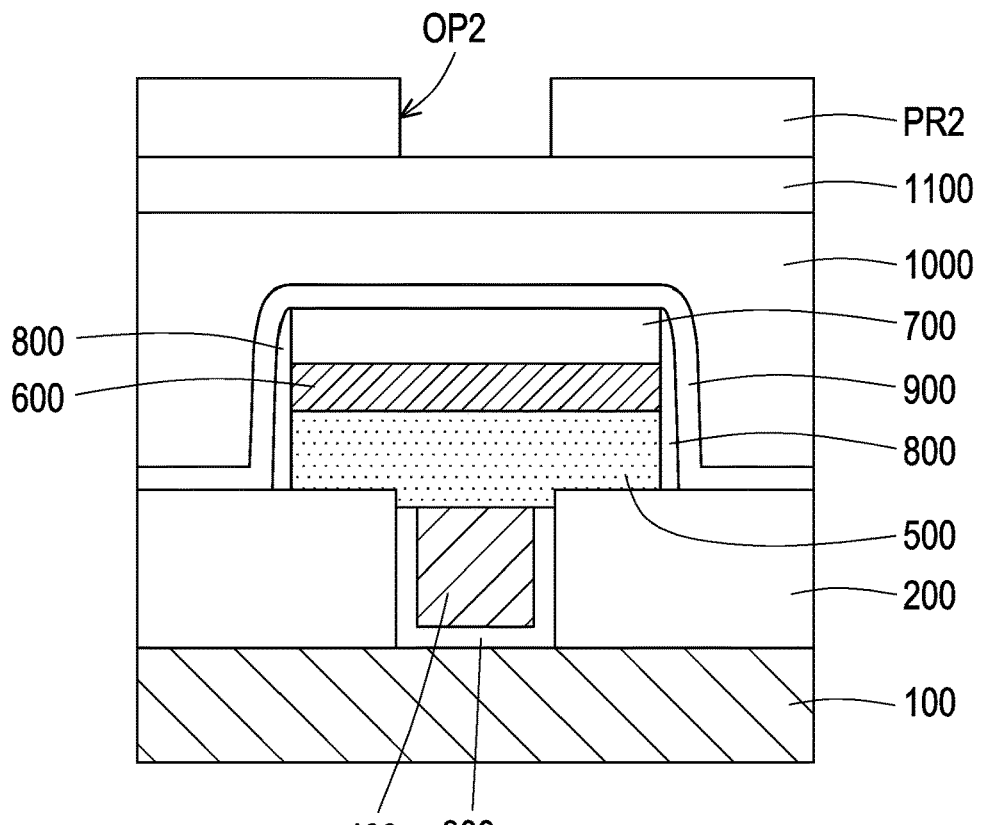
Figure 2O:
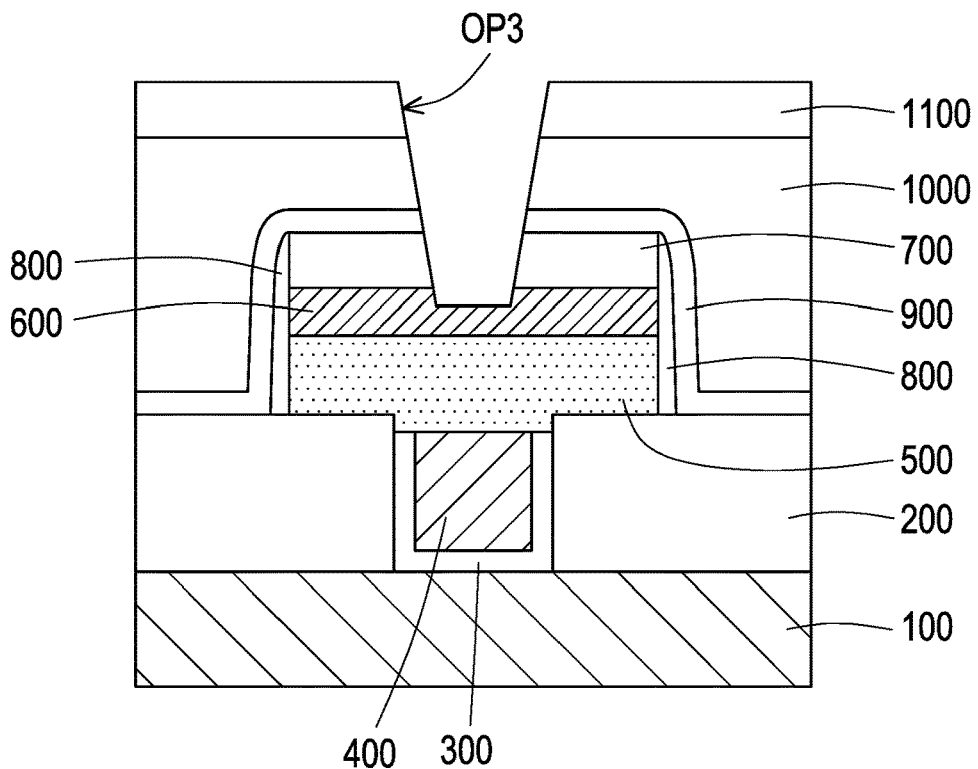
Figure 2P:
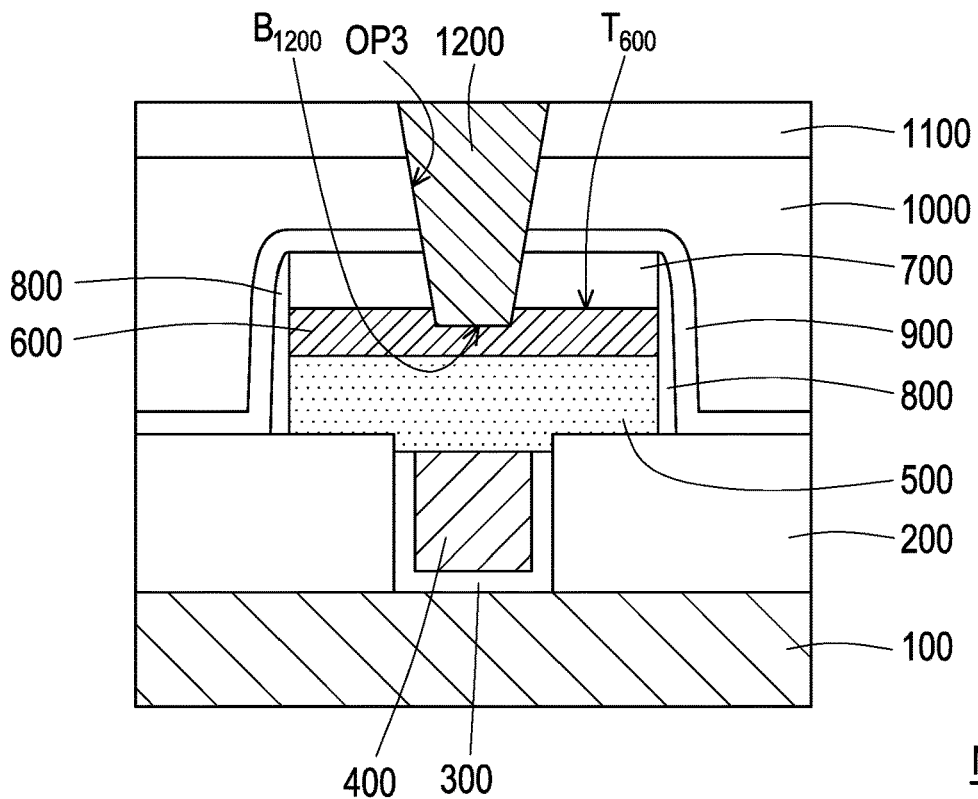

FIG. 2A to FIG. 2P are schematic cross-sectional views illustrating various stages of a manufacturing method of the memory cell MC in FIG. 1. Referring to FIG. 2A, a conductive layer 100 is provided. In some embodiments, the conductive layer 100 is one of the conductive patterns 34 of the interconnection structure 30 of FIG. 1, so the detailed description thereof is omitted herein. Thereafter, a dielectric layer 200 is formed on the conductive layer 100. In some embodiments, the dielectric layer 200 is formed of a low-k dielectric material having a dielectric constant (k-value) lower than about 3.0, about 2.5, or even lower. In some embodiments, the dielectric layer 200 is formed of non-low-k dielectric materials such as silicon oxide, silicon carbide (SiC), silicon carbo-nitride (SiCN), silicon oxy-carbo-nitride (SiOCN), or the like. In some alternative embodiments, the material of the dielectric layer 200 includes polyimide, epoxy resin, acrylic resin, phenol resin, BCB, PBO, or any other suitable polymer-based dielectric material. The dielectric layer 200 may be formed by suitable fabrication techniques such as spin-on coating, CVD, PECVD, or the like.

In some embodiments, the dielectric layer 200 has an opening OP1. For example the dielectric layer 200 is patterned to form the opening OP1. In some embodiments, the dielectric layer 200 is patterned through a photolithography and etching process. For example, a patterned photoresist layer (not shown) is formed on the dielectric layer 200. Thereafter, an etching process is performed to remove the dielectric layer 200 that is not covered by the patterned photoresist layer. The etching process includes, for example, an anisotropic etching process such as dry etch or an isotropic etching process such as wet etch. Subsequently, the patterned photoresist layer is removed through a stripping process or the like to expose the remaining dielectric layer 200. As illustrated in FIG. 2A, the opening OP1 penetrates through the dielectric layer 200 to expose the underlying conductive layer 100.

Referring to FIG. 2B, a barrier material layer 300a is conformally deposited on the dielectric layer 200. For example, the barrier material layer 300a covers a top surface $T_{200}$ of the dielectric layer 200 and extends into the opening OP1 to cover sidewalls and a bottom surface of the opening OP1. For example, the barrier material layer 300a exhibits a U shape in the cross-sectional view, as illustrated in FIG. 2B. In some embodiments, the barrier material layer 300a extends into the opening OP1 to be in physical contact with the conductive layer 100. In some embodiments, materials of the barrier material layer 300a includes titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or a combination thereof. In some embodiments, the barrier material layer 300a is formed by a suitable deposition process, such as CVD, PECVD, flowable chemical vapor deposition (FCVD), HDP-CVD, sub-atmospheric chemical vapor deposition (SACVD), physical vapor deposition (PVD), or atomic layer deposition (ALD).

Referring to FIG. 2C, a bottom electrode material layer 400a is formed on the barrier material layer 300a. For example, the bottom electrode material layer 400a covers a top surface of the barrier material layer 300a. In some embodiments, the bottom electrode material layer 400a fills up the opening OP1. In some embodiments, the bottom electrode material layer 400a includes a metal oxide material, such as $TiO_x$, $WO_x$, $RuO_x$, a combination thereof, or the like. In some alternative embodiments, the bottom electrode material layer 400a includes a metallic material, such as Ti, Co, Cu, AlCu, W, TiN, TiW, TiAl, TiAlN, Ru, a combination thereof, or the like. In some embodiments, the bottom electrode material layer 400a is deposited through ALD, CVD, PVD, or the like.

Referring to FIG. 2C and FIG. 2D, a portion of the barrier material layer 300a and a portion of the bottom electrode material layer 400a are removed. For example, the barrier material layer 300a and the bottom electrode material layer 400a shown in FIG. 2C are thinned until the underlying dielectric layer 200 is exposed, so as to form a barrier layer 300 and a bottom electrode 400. In some embodiments, the barrier material layer 300a and the bottom electrode material layer 400a are thinned through a grinding process, such as a mechanical grinding process, a chemical mechanical polishing (CMP) process, or the like. After grinding, a top surface $T_{200}$ of the dielectric layer 200, a top surface $T_{300}$ of the barrier layer 300, and a top surface $T_{400}$ of the bottom electrode 400 are substantially located at the same level height. In other words, the top surface $T_{200}$ of the dielectric layer 200, the top surface $T_{300}$ of the barrier layer 300, and the top surface $T_{400}$ of the bottom electrode 400 are substantially coplanar. As illustrated in FIG. 2D, the barrier layer 300 and the bottom electrode 400 are located within the dielectric layer 200. In other words, the barrier layer 300 and the bottom electrode 400 are embedded in the dielectric layer 200. That is, the dielectric layer 200 laterally surrounds the barrier layer 300 and the bottom electrode 400. In some embodiments, the barrier layer 300 is sandwiched between the bottom electrode 400 and the dielectric layer 200. In some embodiments, the barrier layer 300 laterally surrounds the bottom electrode 400. For example, the barrier layer 300 exhibits a U-shape from the cross-sectional view to cover sidewalls and a bottom surface of the bottom electrode 400, as illustrated in FIG. 2D. In some embodiments, the barrier layer 300 is utilized to avoid diffusion of atoms between elements (for example, between the bottom electrode 400 and the dielectric layer 200). In some embodiments, the bottom electrode 400 is electrically connected to the conductive layer 100. In some embodiments, after grinding of the barrier material layer 300a and the bottom electrode material layer 400a, residues remain on the top surface $T_{200}$ of the dielectric layer 200, the top surface $T_{300}$ of the barrier layer 300, and the top surface $T_{400}$ of the bottom electrode 400. These residues will contaminate subsequently formed elements and thereby resulting adverse effects. Therefore, a cleaning process may be performed to remove these residues.

Referring to FIG. 2D and FIG. 2E, the cleaning process is performed on the dielectric layer 200, the barrier layer 300, and the bottom electrode 400. In some embodiments, during the cleaning process, a portion of the barrier layer 300 and a portion of the bottom electrode 400 are removed, so the cleaning process is referred to as a double plasma etching treatment ET. That is, the double plasma etching treatment ET is performed on the dielectric layer 200, the barrier layer 300, and the bottom electrode 400 to selectively remove a portion of the barrier layer 300 and a portion of the bottom electrode 400. On the other hand, the dielectric layer 200 is not being affected by the double plasma etching process ET. Taking $TiO_x$ as a material for the bottom electrode 400, the detailed mechanism of the double plasma etching treatment ET for removing a portion of the bottom electrode 400 will be described below in conjunction with FIG. 3A to FIG. 3E.

Figure 3A:
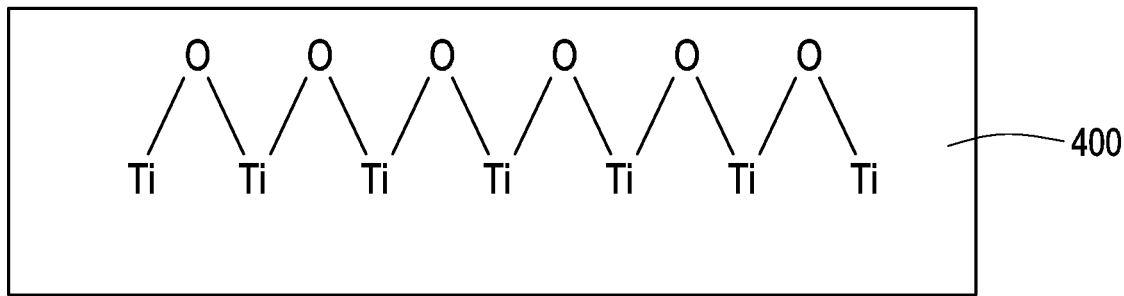
FIG. 3A to FIG. 3E are schematic cross-sectional views illustrating a mechanism of the double plasma etching treatment in FIG. 2E.
Figure 3B:
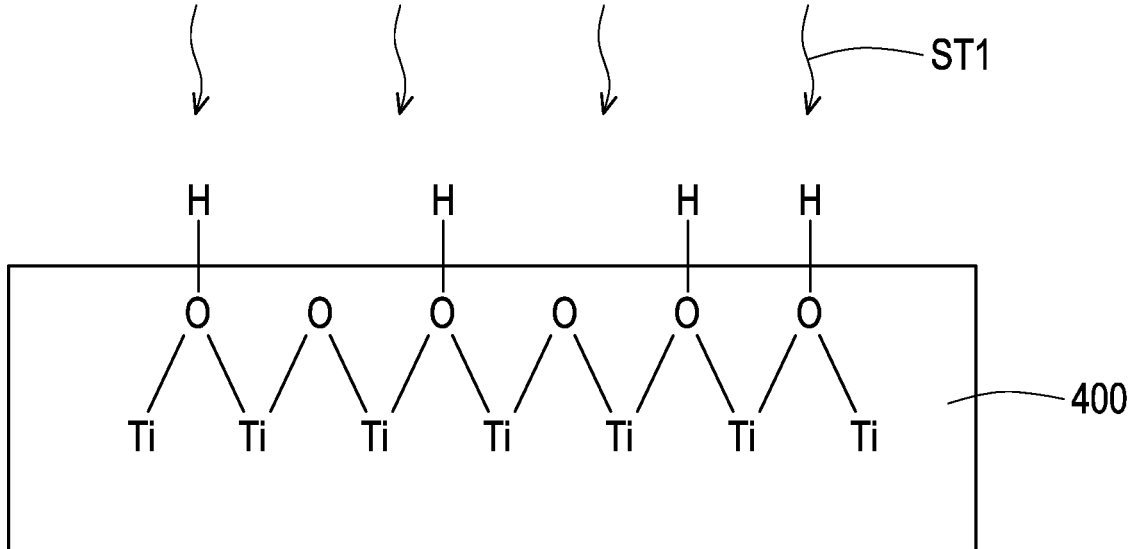

FIG. 3A to FIG. 3E are schematic cross-sectional views illustrating a mechanism of the double plasma etching treatment ET in FIG. 2E. Referring to FIG. 3A and FIG. 3B, a first soaking treatment ST1 is performed on the bottom electrode 400 using a first gas. In some embodiments, the first gas includes $N_2H_2$ or the like. In some embodiments, the $N_2H_2$ gas may serve as hydrogen donor such that some of the oxygen atoms at the top surface of the bottom electrode 400 (i.e. oxygen atoms of $TiO_x$ located at the top surface of the bottom electrode 400) are bonded to the hydrogen atoms originated from $N_2H_2$. In some embodiments, the first soaking treatment ST1 is performed at a temperature ranging from about 200° C. to about 400° C. and a pressure ranging from about 200 mTorr to about 10 Torr. In some embodiments, during the first soaking treatment ST1, a flow rate of the first gas ranges from about 200 standard cubic centimeter per minute (sccm) to about 2000 sccm. In some embodiments, the first soaking treatment ST1 does not involve the introduction of plasma.

Figure 3C:
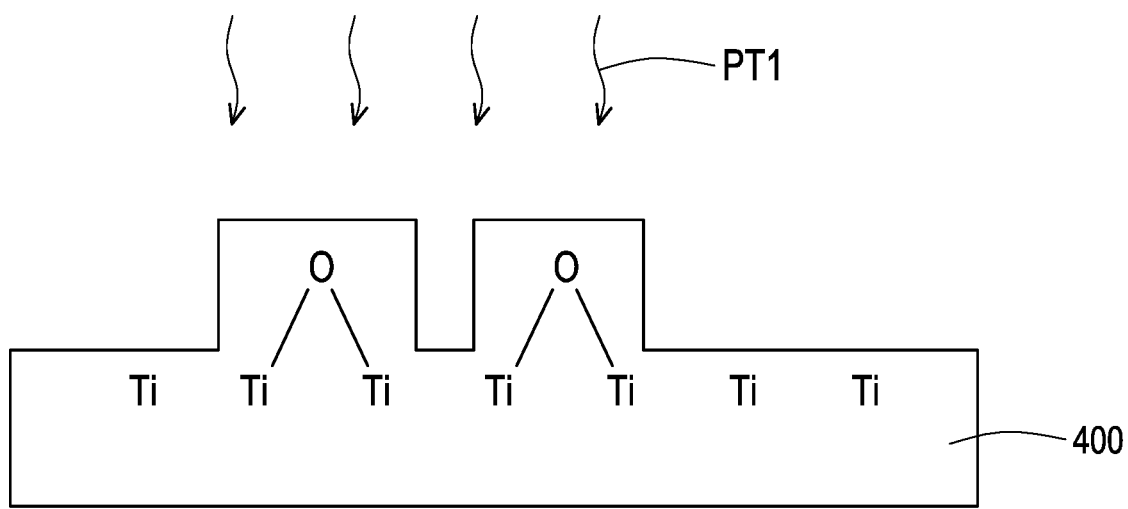

Referring to FIG. 3B and FIG. 3C, after the first soaking treatment ST1, a first plasma treatment PT1 is performed using the first gas to remove a first portion of the bottom electrode 400. For example, the first plasma treatment PT1 lifts off the oxygen atoms that are bonded to the hydrogen atoms. That is, the first plasma treatment PT1 lifts off the OH molecules such that the first portion of the bottom electrode 400 is removed, as illustrated in FIG. 3C. On the other hand, the oxygen atoms that are not bonded to the hydrogen atom maintain their bonding with the titanium atoms and remain in the bottom electrode 400. In some embodiments, the first plasma treatment PT1 is performed at a temperature ranging from about 200° C. to about 400° C. and a pressure ranging from about 100 mTorr to about 10 Torr. In some embodiments, during the first plasma treatment PT1, a flow rate of the first gas ranges from about 200 sccm to about 2000 sccm. In some embodiments, the power suppled in the chamber to generate plasma ranges from about 200 Watts to about 1000 Watts.

Figure 3D:
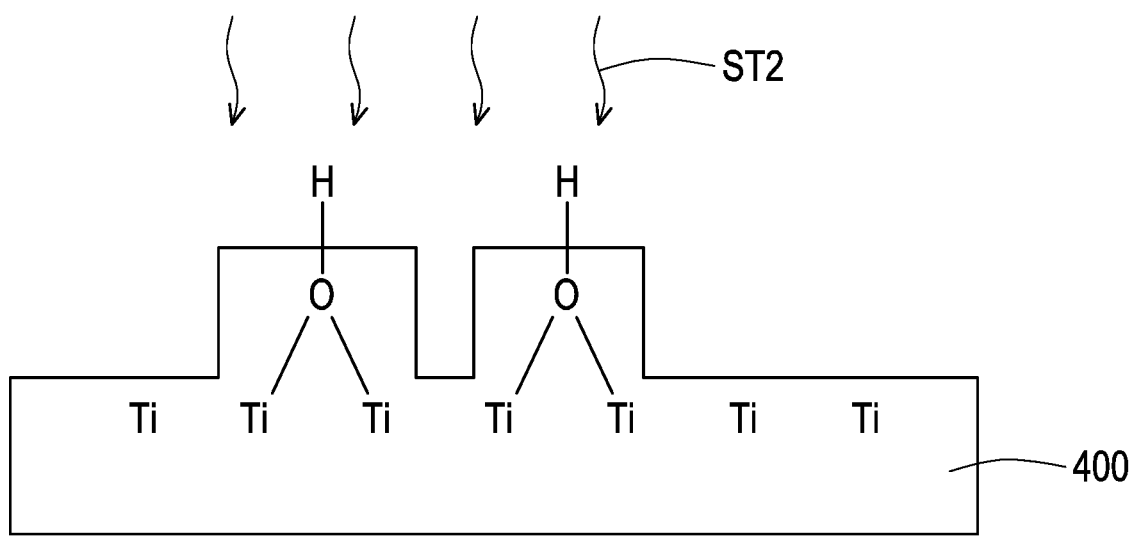

Referring to FIG. 3C and FIG. 3D, after the first plasma treatment PT1, a second soaking treatment ST2 is performed on the bottom electrode 400 using a second gas. In some embodiments, the second gas is different from the first gas. In some embodiments, the second gas includes HBr of the like. Similar to that of the first gas, the HBr gas may also serve as hydrogen donor such that the remaining oxygen atoms at the top surface of the bottom electrode 400 (i.e. oxygen atoms of $TiO_x$ located at the top surface of the bottom electrode 400) are bonded to the hydrogen atoms originated from HBr. In some embodiments, the second soaking treatment ST2 is performed at a temperature ranging from about 200° C. to about 400° C. and a pressure ranging from about 100 mTorr to about 10 Torr. In some embodiments, during the second soaking treatment ST2, a flow rate of the second gas ranges from about 200 sccm to about 2000 sccm. In some embodiments, the second soaking treatment ST2 does not involve the introduction of plasma.

Figure 3E:
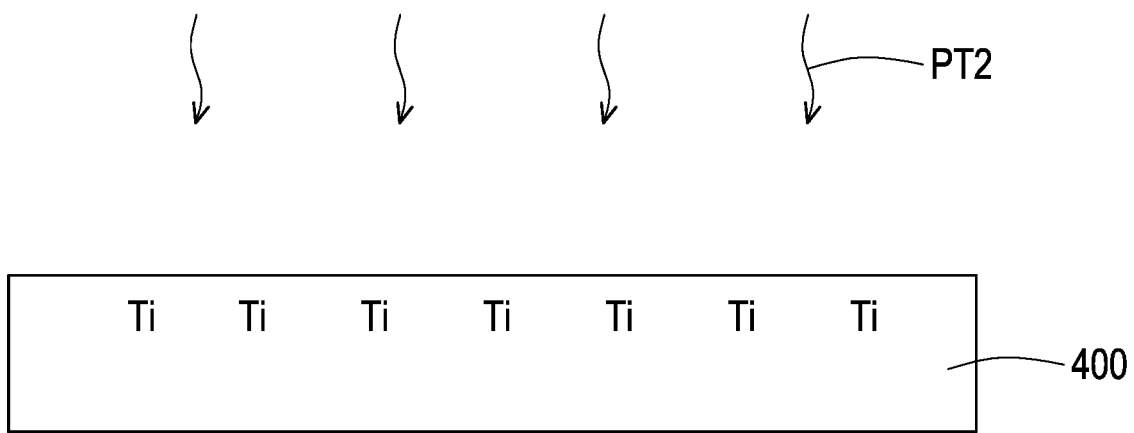

Referring to FIG. 3D and FIG. 3E, after the second soaking treatment ST2, a second plasma treatment PT2 is performed using the second gas to remove a second portion of the bottom electrode 400. For example, the second plasma treatment PT2 lifts off the oxygen atoms that are bonded to the hydrogen atoms. That is, the second plasma treatment PT1 lifts off the OH molecules such that the second portion of the bottom electrode 400 is removed, as illustrated in FIG. 3E. On the other hand, the titanium atoms remain at the top surface of the bottom electrode 400. In some embodiments, the second plasma treatment PT2 is performed at a temperature ranging from about 200° C. to about 400° C. and a pressure ranging from about 100 mTorr to about 10 Torr. In some embodiments, during the second plasma treatment PT2, a flow rate of the second gas ranges from about 200 sccm to about 2000 sccm. In some embodiments, the power suppled in the chamber to generate plasma ranges from about 200 Watts to about 1000 Watts.

In some embodiments, the double plasma etching treatment ET is a combination of the first soaking treatment ST1, the first plasma treatment PT1, the second soaking treatment ST2, and the second plasma treatment PT2 shown in FIG. 3A to FIG. 3E. Referring to FIG. 3A to FIG. 3E, the double plasma etching treatment ET removes a portion of the bottom electrode 400. In other words, the double plasma etching treatment ET reduces an overall thickness of the bottom electrode 400. In some embodiments, since the double plasma etching treatment ET removes oxygen atoms from titanium atoms, the double plasma etching treatment ET may also be referred to as a chemical reduction treatment of metal oxides.

Although FIG. 3A to FIG. 3E illustrated that the double plasma etching treatment ET is utilized to remove a portion of the bottom electrode 400, the disclosure is not limited thereto. In some embodiments, the double plasma etching treatment ET is also applicable for removing a portion of the barrier layer 300 shown in FIG. 2D. Specifically, referring back to FIG. 2D and FIG. 2E, the barrier layer 300 and the bottom electrode 400 in the opening OP1 as shown in FIG. 2E are being recessed. After recessing of the barrier layer 300 and the bottom electrode 400, a recess R is formed above the remaining barrier layer 300 and the remaining bottom electrode 400. For example, the recess R sinks from the top surface $T_{200}$ of the dielectric layer 200 toward the top surface $T_{300}$ of the barrier layer 300 and the top surface $T_{400}$ of the bottom electrode 400. That is, as illustrated in FIG. 2E, the top surface $T_{300}$ of the barrier layer 300 and the top surface $T_{400}$ of the bottom electrode 400 are located at a level height lower than that of the top surface $T_{200}$ of the dielectric layer 200. Meanwhile, the top surface $T_{300}$ of the barrier layer 300 and the top surface $T_{400}$ of the bottom electrode 400 are located at the same level height. That is, the top surface $T_{300}$ of the barrier layer 300 and the top surface $T_{400}$ of the bottom electrode 400 are substantially coplanar.

In some embodiments, the barrier layer 300 and the bottom electrode 400 are recessed such that a depth $D_R$ of the recess R ranges from about 3 Å to about 10 Å. As illustrated in FIG. 2E, a sum of a minimum thickness $t_{000}$ of the barrier layer, a thickness $t_{400}$ of the bottom electrode 400, and the depth $D_R$ of the recess R is substantially equal to a thickness $t_{200}$ of the dielectric layer 200. In some embodiments, the minimum thickness $t_{000}$ of the barrier layer ranges from about 1 nm to about 4 nm, and the thickness $t_{400}$ of the bottom electrode ranges from about 50 nm to about 80 nm. On the other hand, the thickness $t_{200}$ of the dielectric layer 200 ranges from about 52 nm to about 82 nm.

FIG. 2E illustrated that the double plasma etching treatment ET recesses both the barrier layer 300 and the bottom electrode 400. However, the disclosure is not limited thereto. In some alternative embodiments, the double plasma etching treatment ET only recesses the bottom electrode 400 and the barrier layer 300 remains unchanged after the double plasma etching treatment ET. Such scenario will be described below in conjunction with FIG. 4.

Figure 4:
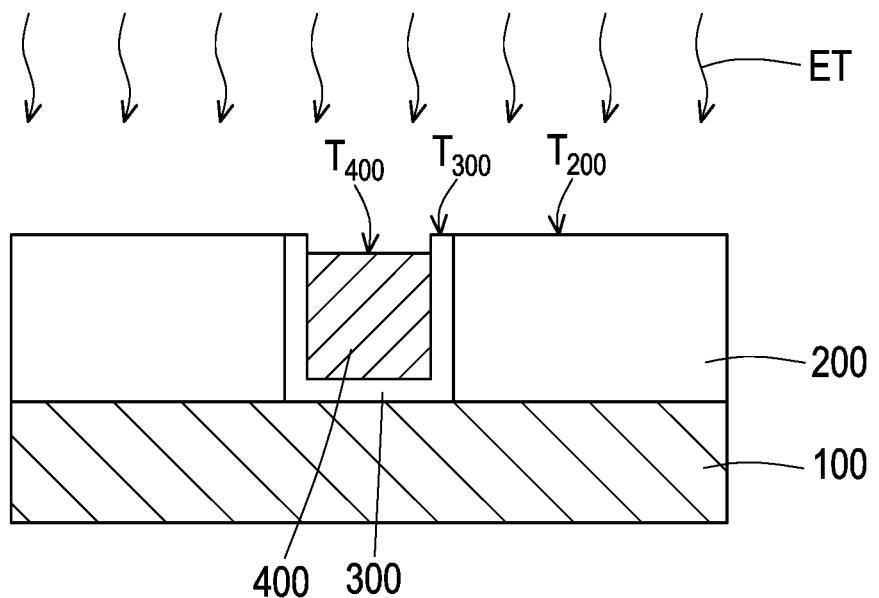
FIG. 4 is a schematic cross-sectional view illustrating an intermediate stage of the manufacturing method of the memory cell in accordance with some alternative embodiments of the disclosure.

FIG. 4 is a schematic cross-sectional view illustrating an intermediate stage of the manufacturing method of the memory cell MC1 in accordance with some alternative embodiments of the disclosure. Referring to FIG. 4, both of the dielectric layer 200 and the barrier layer 300 are undamaged by the double plasma etching treatment ET. Meanwhile, a portion of the bottom electrode 400 is removed by the double plasma etching treatment ET. In other words, the double plasma etching treatment ET only recesses the bottom electrode 400. As a result, the top surface $T_{300}$ of the barrier layer 300 and the top surface $T_{200}$ of the dielectric layer 200 are located at the same level height. That is, the top surface $T_{300}$ of the barrier layer 300 and the top surface $T_{200}$ of the dielectric layer 200 are substantially coplanar. On the other hand, the top surface $T_{400}$ of the bottom electrode 400 is located at a level height lower than that of the top surface $T_{300}$ of the barrier layer 300 and the top surface $T_{200}$ of the dielectric layer 200.

FIG. 2E illustrated that the barrier layer 300 and the bottom electrode 400 are being recessed at the same rate through the double plasma etching treatment ET. However, the disclosure is not limited thereto. In some alternative embodiments, the barrier layer 300 and the bottom electrode 400 may be recessed by the double plasma etching treatment ET at different rates. Such scenario will be described below in conjunction with FIG. 5.

Figure 5:
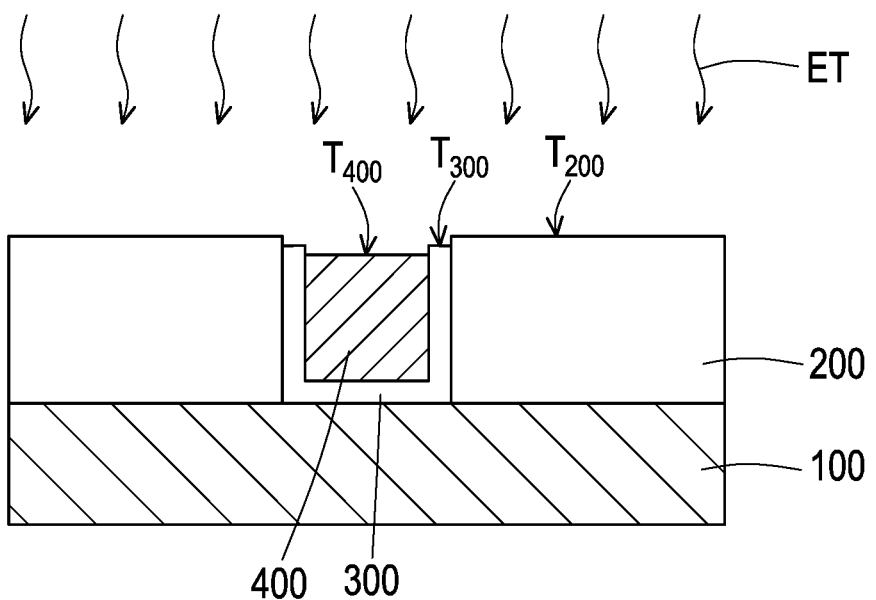
FIG. 5 is a schematic cross-sectional view illustrating an intermediate stage of the manufacturing method of the memory cell in accordance with some alternative embodiments of the disclosure.

FIG. 5 is a schematic cross-sectional view illustrating an intermediate stage of the manufacturing method of the memory cell MC2 in accordance with some alternative embodiments of the disclosure. Referring to FIG. 5, the double plasma etching treatment ET removes a portion of the bottom electrode 400 and a portion of the barrier layer 300. However, the bottom electrode 400 is being removed at a rate different from that of the barrier layer 300. As a result, the top surface $T_{400}$ of the bottom electrode 400 is located at a level height lower than that of the top surface $T_{300}$ of the barrier layer 300. On the other hand, since the dielectric layer 200 is undamaged by the double plasma etching treatment ET, the top surface $T_{200}$ of the dielectric layer 200 is located at a level height higher than that of the top surface $T_{300}$ of the barrier layer 300. In other words, the dielectric layer 200, the barrier layer 300, and the bottom electrode 400 exhibits a staircase shape from the cross-sectional view illustrated in FIG. 5.

It should be noted that although FIG. 2E, FIG. 4, and FIG. 5 illustrated that the top surface $T_{300}$ of the barrier layer 300 and the top surface $T_{400}$ of the bottom electrode 400 are substantially flat, the disclosure is not limited thereto. In some alternative embodiments, the top surface $T_{300}$ of the barrier layer 300 is not flat and may have a roughness ranging from about 0.5 nm to about 2 nm. Similarly, the top surface $T_{400}$ of the bottom electrode is also not flat and may have a roughness ranging from about 1 nm to about 2 nm.

In some embodiments, when multiple memory cells are formed, the double plasma etching treatment ET allows consistence cell profile in different areas. For example, the cell profiles of different memory cells located in the iso-area and the dense-area are substantially identical. Therefore, the double plasma etching process ET may sufficiently reduce the loading effect derived from non-uniformity in the iso-area and the dense-area.

Referring to FIG. 2F, after performing the double plasma etching treatment ET, a variable resistance layer 500 is deposited on the dielectric layer 200, the barrier layer 300, and the bottom electrode 400. In some embodiments, the variable resistance layer 500 includes a phase change material. The phase change material may include a chalcogenide material, such as an indium (In)-antimony(Sb)-tellurium (Te) (IST) material or a germanium(Ge)-antimony(Sb)-tellurium(Te) (GST) material. In some embodiments, the ISG material includes $In_2Sb_2Te_5$, $In_1Sb_2Te_4$, $In_1Sb_4Te_7$, or the like. On the other hand, the GST material includes $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. In some alternative embodiments, other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt. In some embodiments, the variable resistance layer 500 is deposited by a suitable deposition process, such as CVD, PECVD, FCVD, HDP-CVD, SACVD, PVD, or ALD.

In some embodiments, the variable resistance layer 500 includes a body portion 500a and a protruding portion 500b connected to the body portion 500a. In some embodiments, the protruding portion 500b protrudes from a bottom surface $B_{500}$ of the body portion 500a. For example, the protruding portion 500b protrudes from the body portion 500a to fill up the recess R. In other words, the variable resistance layer 500 extends into the opening OP1 to fill up the opening OP1. As illustrated in FIG. 2F, the variable resistance layer 500 contacts the top surface $T_{200}$ of the dielectric layer 200, the top surface $T_{300}$ of the barrier layer 300, and the top surface $T_{400}$ of the bottom electrode 400. That is, a portion of a bottom surface of the variable resistance layer 500 is coplanar with the top surface $T_{200}$ of the dielectric layer 200, and another portion of the bottom surface of the variable resistance layer 500 is coplanar with the top surface $T_{300}$ of the barrier layer 300 and the top surface $T_{400}$ of the bottom electrode 400. For example, the bottom surface $B_{500a}$ of the body portion 500a is coplanar with the top surface $T_{200}$ of the dielectric layer 200 while a bottom surface $B_{500b}$ of the protruding portion 500b is coplanar with the top surface $T_{300}$ of the barrier layer 300 and the top surface $T_{400}$ of the bottom electrode 400. In some embodiments, the bottom surface $B_{500b}$ of the protruding portion 500b and the top surface $T_{400}$ of the bottom electrode 400 form a thermal conservation interface.

In some embodiments, since the protruding portion 500b of the variable resistance layer 500 fills up the recess R, a thickness $t_{500b}$ of the protruding portion 500b is substantially equal to the depth $D_R$ of the recess R. For example, the thickness $t_{500b}$ of the protruding portion 500b ranges from about 3 Å to about 10 Å. As illustrated in FIG. 2F, a sum of the minimum thickness $t_{300}$ of the barrier layer 300, the thickness $t_{400}$ of the bottom electrode 400, and the thickness $t_{500b}$ of the protruding portion 500b of the variable resistance layer 500 is substantially equal to the thickness $t_{200}$ of the dielectric layer 200.

In some embodiments, since the variable resistance layer 500 includes a phase change material, the variable resistance layer 500 has a variable phase representing a data bit. For example, the variable resistance layer 500 has a crystalline phase and an amorphous phase which are interchangeable. The crystalline phase and the amorphous phase may respectively represent a binary "1" and a binary "0," or vice versa. Accordingly, the variable resistance layer 500 has a variable resistance that changes with the variable phase of the variable resistance layer 500. For example, the variable resistance layer 500 has a high resistance in the amorphous phase and a low resistance in the crystalline phase.

In some embodiments, the phase of the variable resistance layer 500 is changed by heating. For example, the bottom electrode 400 heats the variable resistance layer 500 to a first temperature that induces crystallization of the variable resistance layer 500, so as to change the variable resistance layer 500 to the crystalline phase (e.g., to set the subsequently formed memory cell MC). Similarly, the bottom electrode 400 heats the variable resistance layer 500 to a second temperature that melts the variable resistance layer 500, so as to change the variable resistance layer 500 to the amorphous phase (e.g., to reset the subsequently formed memory cell MC). In some embodiments, the first temperature is lower than the second temperature. For example, the first temperature is about 100° C. to about 200° C. and the second temperature is about 500° C. to about 800° C. Since the phase change of the variable resistance layer 500 relies on the temperature difference, thermal confinement is crucial in the memory cell MC. As mentioned above, the protruding portion 500b of the variable resistance layer 500 fills into the recess R such that the bottom surface $B_{500b}$ of the protruding portion 500b and the top surface $T_{400}$ of the bottom electrode 400 form the thermal conservation interface. Since the thermal conservation interface between the variable resistance layer 500 and the bottom electrode 400 is located within the recess R, the heat can be sufficiently conserved within the variable resistance layer 500. In other words, the heat dissipation within the variable resistance layer 500 may be sufficiently reduced with the configuration shown in FIG. 2F, thereby ensuring the performance of the subsequently formed memory cell MC.

In some embodiments, the amount of heat generated by the bottom electrode 400 varies in proportion to the current applied to the bottom electrode 400. That is, the variable resistance layer 500 is heated up to a certain temperature when a certain current passes through the bottom electrode 400. In other words, the reset current ($I_{RESET}$) of the subsequently formed memory cell MC is related to the heat conserved within the variable resistance layer 500. As mentioned above, since the protruding portion 500b of the variable resistance layer 500 sufficiently aids the conservation of heat within the variable resistance layer 500, the configuration shown in FIG. 2F may also sufficiently lower the reset current of the subsequently formed memory cell MC. As such, the performance of the subsequently formed memory cell MC may be further enhanced.

Referring to FIG. 2G, a top electrode 600 is formed on the variable resistance layer 500. In some embodiments, a material of the top electrode 600 is the same as the material of the bottom electrode 400. However, the disclosure is not limited thereto. In some alternative embodiments, the material of the top electrode 600 may be different from the material of the bottom electrode 400. In some embodiments, the top electrode 600 includes a metal oxide material, such as $TiO_x$, $WO_x$, $RuO_x$, a combination thereof, or the like. In some alternative embodiments, the top electrode 600 includes a metallic material, such as Ti, Co, Cu, AlCu, W, TiN, TiW, TiAl, TiAlN, Ru, a combination thereof, or the like. In some embodiments, the top electrode 600 is deposited through ALD, CVD, PVD, or the like.

Referring to FIG. 2H, a hard mask layer 700 is formed on the top electrode 600. In some embodiments, the hard mask layer 700 is made of non-metallic materials, such as $SiO_2$, SiC, SiN, SiON, or the like. However, the disclosure is not limited thereto. In some alternative embodiments, the hard mask layer 700 is made of metallic materials, such as Ti, TiN, Ta, TaN, Al, or the like. In some embodiments, the hard mask layer 700 is formed by CVD, PECVD, ALD, PVD, a combination thereof, or the like.

Referring to FIG. 2I, a photoresist layer PR1 is formed on the hard mask layer 700. In some embodiments, the photoresist layer PR1 partially coves the hard mask layer 700. In other words, at least a portion of the hard mask layer 700 is exposed by the photoresist layer PR1.

Referring to FIG. 2I and FIG. 2J, the hard mask layer 700, the top electrode 600, and the variable resistance layer 500 are patterned using the photoresist layer PR1 as a mask. For example, an etching process is performed to remove a portion of the hard mask layer 700, a portion of the top electrode 600, and a portion of the variable resistance layer 500 that are not covered by the photoresist layer PR1. The etching process includes, for example, an anisotropic etching process such as dry etch or an isotropic etching process such as wet etch. Subsequently, the photoresist layer PR1 is removed through a stripping process or the like. In some embodiments, the hard mask layer 700, the top electrode 600, and the variable resistance layer 500 are patterned simultaneously through the same process. As such, sidewalls of the hard mask layer 700, sidewalls of the top electrode 600, and sidewalls of the variable resistance layer 500 are aligned. As illustrated in FIG. 2J, after the hard mask layer 700, the top electrode 600, and the variable resistance layer 500 are patterned, a portion of the dielectric layer 200 is exposed.

Referring to FIG. 2K, a pair of spacers 800 is formed aside the hard mask layer 700, the top electrode 600, and the variable resistance layer 500. For example, the pair of spacers 800 is disposed on the dielectric layer 200 and covers the sidewalls of the hard mask layer 700, the sidewalls of the top electrode 600, and the sidewalls of the variable resistance layer 500. In some embodiments, the spacers 800 are formed of dielectric materials, such as silicon oxide, silicon nitride, SiCN, SiOCN, a combination thereof, or the like. In some embodiments, the spacers 800 are formed by a deposition followed by an anisotropic etch. Although FIG. 2K illustrated that the spacers 800 are single-layered structure, the disclosure is not limited thereto. In some alternative embodiments, the spacers 800 may be a multi-layered structure.

Referring to FIG. 2L, an etch stop layer 900 is formed on the dielectric layer 200, the pair of spacers 800, and the hard mask layer 700. For example, the etch stop layer 900 conformally covers the dielectric layer 200, the pair of spacers 800, and the hard mask layer 700. In some embodiments, the etch stop layer 900 includes silicon carbide, silicon nitride, silicon oxynitride, silicon carbo-nitride, or multi-layers thereof. In some embodiments, the etch stop layer 900 is deposited using CVD, HDP-CVD, SACVD, molecular layer deposition (MLD), or other suitable methods.

Referring to FIG. 2M, a dielectric layer 1000 and a hard mask layer 1100 are sequentially disposed on the etch stop layer 900. For example, the dielectric layer 1000 is sandwiched between the etch stop layer 900 and the hard mask layer 1100. In some embodiments, a material of the dielectric layer 1000 is the same as the material of the dielectric layer 200. However, the disclosure is not limited thereto. In some alternative embodiments, the material of the dielectric layer 1000 is different from the material of the dielectric layer 200. In some embodiments, the dielectric layer 1000 is formed of a low-k dielectric material having a k-value lower than about 3.0, about 2.5, or even lower. In some embodiments, the dielectric layer 1000 is formed of non-low-k dielectric materials such as silicon oxide, SiC, SiCN, SiOCN, or the like. In some alternative embodiments, the material of the dielectric layer 1000 includes polyimide, epoxy resin, acrylic resin, phenol resin, BCB, PBO, or any other suitable polymer-based dielectric material. The dielectric layer 1000 may be formed by suitable fabrication techniques such as spin-on coating, CVD, PECVD, or the like.

In some embodiments, a material of the hard mask layer 1100 is the same as the material of the hard mask layer 700. However, the disclosure is not limited thereto. In some alternative embodiments, the material of the hard mask layer 1100 is different from the material of the hard mask layer 700. In some embodiments, the hard mask layer 1100 is made of non-metallic materials, such as $SiO_2$, SiC, SiN, SiON, or the like. However, the disclosure is not limited thereto. In some alternative embodiments, the hard mask layer 1100 is made of metallic materials, such as Ti, TiN, Ta, TaN, Al, or the like. In some embodiments, the hard mask layer 1100 is formed by CVD, PECVD, ALD, PVD, a combination thereof, or the like.

Referring to FIG. 2N, a photoresist layer PR2 is formed on the hard mask layer 1100. In some embodiments, the photoresist layer PR2 partially covers the hard mask layer 1100. For example, the photoresist layer PR2 has an opening OP2 which exposes a portion of the hard mask layer 1100.

Referring to FIG. 2N and FIG. 2O, the hard mask layer 1100, the dielectric layer 1000, the etch stop layer 900, the hard mask layer 700, and the top electrode 600 are patterned using the photoresist layer PR2 as a mask. For example, an etching process is performed to remove a portion of the hard mask layer 1100, a portion of the dielectric layer 1000, a portion of the etch stop layer 900, a portion of the hard mask layer 700, and a portion of the top electrode 600, so as to form an opening OP3. The etching process includes, for example, an anisotropic etching process such as dry etch or an isotropic etching process such as wet etch. Subsequently, the photoresist layer PR2 is removed through a stripping process or the like. As illustrated in FIG. 2O, the opening OP3 penetrates through the hard mask layer 1100, the dielectric layer 1000, the etch stop layer 900, and the hard mask layer 700. On the other hand, although the opening OP3 does not penetrate through the top electrode 600, the opening OP3 extends into the top electrode 600.

Referring to FIG. 2P, a conductive contact 1200 is formed in the opening OP3 to form the memory cell MC. In some embodiments, the conductive contact 1200 is formed by filling a conductive material (not shown) into the opening OP3. The conductive material includes, for example, tungsten, aluminum, copper, titanium, tantalum, titanium nitride, tantalum nitride, alloys therefore, and/or multi-layers thereof. Subsequently, a planarization process is performed to remove excess portions of the conductive material over the hard mask layer 1100, so as to form the conductive contact 1200. As illustrated in FIG. 2P, the conductive contact 1200 penetrates through the hard mask layer 1100, the dielectric layer 1000, the etch stop layer 900, and the hard mask layer 700 to be in physical contact with the top electrode 600. As mentioned above, since the opening OP3 extends into the top electrode 600, the conductive contact 1200, which fills up the opening OP3, also extends into the top electrode 600. For example, as illustrated in FIG. 2P, a bottom surface $B_{1200}$ of the conductive contact 1200 is located at a level height lower than that of a topmost surface $T_{600}$ of the top electrode 600.

Referring to FIG. 2P and FIG. 1, some of the conductive vias 32 shown in FIG. 1 may serve as the conductive contact 1200 to electrically connect the memory cell MC with the conductive patterns 34. In other words, the memory cell MC is electrically connected to the first transistor T1, the second transistor T2, and/or the conductive terminals 70 through the conductive vias 32 and the conductive patterns 34 of the interconnection structure 30.

Figure 6:
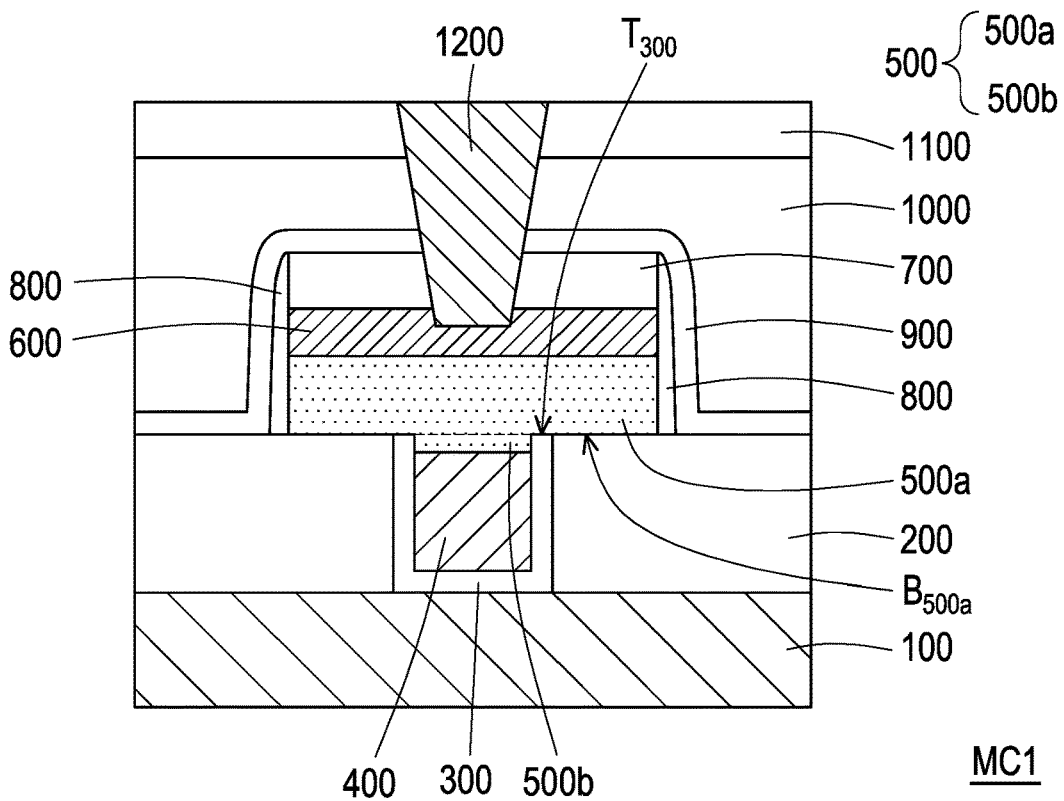
FIG. 6 is a schematic cross-sectional view of a memory cell in accordance with some alternative embodiments of the disclosure.

FIG. 6 is a schematic cross-sectional view of a memory cell MC1 in accordance with some alternative embodiments of the disclosure. The memory cell MC1 in FIG. 6 corresponds to the final product of the intermediate stage shown in FIG. 4. Referring to FIG. 6, the memory cell MC1 is similar to the memory cell MC in FIG. 2P, so the detailed descriptions thereof are omitted herein. However, in the memory cell MC1 of FIG. 6, the barrier layer 300 not only laterally surrounds the bottom electrode 400, but also laterally surrounds the protruding portion 500b of the variable resistance layer 500. For example, sidewalls of the protruding portion 500b of the variable resistance layer 500 are in physical contact with the barrier layer 300. In some embodiments, the top surface $T_{300}$ of the barrier layer 300 is coplanar with a bottom surface $B_{500a}$ of the body portion 500a of the variable resistance layer 500.

In some embodiments, with the configuration as shown FIG. 6, the heat can be sufficiently conserved within the variable resistance layer 500. In other words, the heat dissipation within the variable resistance layer 500 of the memory cell MC1 may be sufficiently reduced. Moreover, since the protruding portion 500b of the variable resistance layer 500 sufficiently aids the conservation of heat within the variable resistance layer 500, the configuration shown in FIG. 6 may also sufficiently lower the reset current of the memory cell MC1. As such, the performance of the memory cell MC1 may be ensured.

Figure 7:
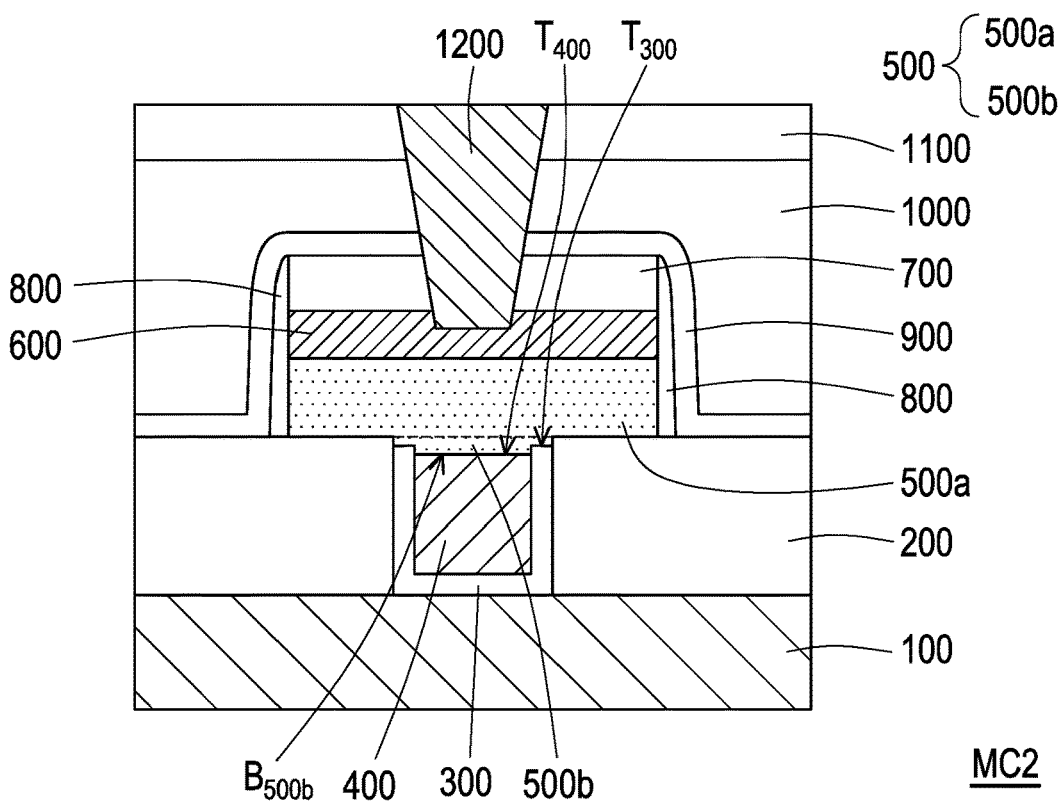
FIG. 7 is a schematic cross-sectional view of a memory cell in accordance with some alternative embodiments of the disclosure.

FIG. 7 is a schematic cross-sectional view of a memory cell MC2 in accordance with some alternative embodiments of the disclosure. The memory cell MC2 in FIG. 7 corresponds to the final product of the intermediate stage shown in FIG. 5. Referring to FIG. 7, the memory cell MC2 is similar to the memory cell MC in FIG. 2P, so the detailed descriptions thereof are omitted herein. However, in the memory cell MC2 of FIG. 7, a portion of the protruding portion 500b of the variable resistance layer 500 is being laterally surrounded by the barrier layer 300 while another portion of the protruding portion 500b of the variable resistance layer 500 is being laterally surrounded by the dielectric layer 200. For example, a portion of the sidewall of the protruding portion 500b of the variable resistance layer 500 is in physical contact with the barrier layer 300 while another portion of the sidewall of the protruding portion 500b of the variable resistance layer 500 is in physical contact with the dielectric layer 200. In some embodiments, the top surface $T_{300}$ of the barrier layer 300 is coplanar with a portion of a bottom surface $B_{500b}$ of the protruding portion 500b of the variable resistance layer 500 while the top surface $T_{400}$ of the bottom electrode 400 is coplanar with another portion of the bottom surface $B_{500b}$ of the protruding portion 500b of the variable resistance layer 500. In some embodiments, the protruding portion 500b of the variable resistance layer 500 exhibits a staircase shape from the cross-sectional view illustrated in FIG. 7.

In some embodiments, with the configuration as shown FIG. 7, the heat can be sufficiently conserved within the variable resistance layer 500. In other words, the heat dissipation within the variable resistance layer 500 of the memory cell MC2 may be sufficiently reduced. Moreover, since the protruding portion 500b of the variable resistance layer 500 sufficiently aids the conservation of heat within the variable resistance layer 500, the configuration shown in FIG. 7 may also sufficiently lower the reset current of the memory cell MC2. As such, the performance of the memory cell MC2 may be ensured.

In accordance with some embodiments of the disclosure, a memory cell includes a bottom electrode, a first dielectric layer, a variable resistance layer, and a top electrode. The first dielectric layer laterally surrounds the bottom electrode. A top surface of the bottom electrode is located at a level height lower than that of a top surface of the first dielectric layer. The variable resistance layer is disposed on the bottom electrode and the first dielectric layer. The variable resistance layer contacts the top surface of the bottom electrode and the top surface of the first dielectric layer. The top electrode is disposed on the variable resistance layer.

In accordance with some embodiments of the disclosure, an integrated circuit includes a substrate, a first transistor, and an interconnect structure. The first transistor is over the substrate. The interconnect structure is disposed on the substrate. The interconnect structure includes a memory cell. The memory cell includes a bottom electrode, a first dielectric layer, a variable resistance layer, and a top electrode. The first dielectric layer laterally surrounds the bottom electrode. The variable resistance layer is disposed on the bottom electrode and the first dielectric layer. The variable resistance layer includes a body portion and a protruding portion connected to the body portion. A bottom surface of the protruding portion and a top surface of the bottom electrode form a thermal conservation interface. The top electrode is disposed on the variable resistance layer.

In accordance with some embodiments of the disclosure, a manufacturing method of a memory cell includes at least the following steps. A first dielectric layer having an opening is provided. A bottom electrode is formed within the opening. A double plasma etching treatment is performed to recess the bottom electrode in the opening. A variable resistance layer is deposited over the first dielectric layer and the bottom electrode. The variable resistance layer fills up the opening. A top electrode is formed on the variable resistance layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
   a bottom electrode;
   a first dielectric layer laterally surrounding the bottom electrode;
   a top electrode disposed over the bottom electrode and the first dielectric layer; and
   a variable resistance layer sandwiched between the bottom electrode and the top electrode and between the first dielectric layer and the top electrode, wherein the variable resistance layer exhibits a T-shape in a cross-sectional view.

2. The memory cell of claim 1, further comprising a barrier layer sandwiched between the bottom electrode and the first dielectric layer.

3. The memory cell of claim 2, wherein a top surface of the barrier layer and a top surface of the bottom electrode are located at the same level height.

4. The memory cell of claim 2, wherein a top surface of the barrier layer and a top surface of the first dielectric layer are located at the same level height.

5. The memory cell of claim 2, wherein the barrier layer exhibits a U-shape in the cross-sectional view.

6. The memory cell of claim 1, further comprising:
   a hard mask layer disposed on the top electrode;
   a pair of spacers disposed aside the variable resistance layer, the top electrode, and the hard mask layer;
   an etch stop layer covering the first dielectric layer, the pair of spacers, and the hard mask layer;
   a second dielectric layer disposed on the etch stop layer; and
   a conductive contact penetrating through the second dielectric layer, the etch stop layer, and the hard mask layer to be in physical contact with the top electrode.

7. The memory cell of claim 6, wherein a bottom surface of the conductive contact is located at a level height lower than that of a topmost surface of the top electrode.

8. The memory cell of claim 6, wherein sidewalls of the hard mask layer, sidewalls of the top electrode, and sidewalls of the variable resistance layer are aligned.

9. An integrated circuit, comprising:
   an interconnect structure, comprising:
      a memory cell, comprising:
         a bottom electrode;
         a top electrode disposed over the bottom electrode; and a variable resistance layer sandwiched between the bottom electrode and the top electrode, wherein the variable resistance layer comprises a body portion and a protruding portion extending out from the body portion, the body portion is spatially separated from bottom electrode, and the protruding portion is in physical contact with the bottom electrode to form a thermal conservation interface; and a first transistor completely embedded in the interconnect structure; and a second transistor partially embedded in the interconnect structure.

10. The integrated circuit of claim 9, wherein the memory cell further comprises:

a first dielectric layer laterally surrounding the bottom electrode; and a barrier layer sandwiched between the bottom electrode and the first dielectric layer.

11. The integrated circuit of claim 10, wherein a sum of a minimum thickness of the barrier layer, a thickness of the bottom electrode, and a thickness of the protruding portion of the variable resistance layer is substantially equal to a thickness of the first dielectric layer.

12. The integrated circuit of claim 10, wherein the barrier layer laterally surrounds the bottom electrode.

13. The integrated circuit of claim 12, wherein the barrier layer further laterally surrounds the protruding portion of the variable resistance layer.

14. The integrated circuit of claim 9, wherein the variable resistance layer comprises an indium (In)-antimony (Sb)-tellurium (Te) (IST) material or a germanium (Ge)-antimony (Sb)-tellurium (Te) (GST) material.

15. A manufacturing method of a memory cell, comprising:

providing a first dielectric layer having an opening;

forming a bottom electrode within the opening;

removing a top portion of the bottom electrode to form a hollow space in the opening;

depositing a variable resistance layer on the first dielectric layer and in the hollow space such that the variable resistance layer is in physical contact with the bottom electrode; and forming a top electrode on the variable resistance layer.

16. The method of claim 15, wherein removing the top portion of the bottom electrode comprises:

performing a first soaking treatment on the bottom electrode using a first gas;

performing a first plasma treatment using the first gas to remove a first portion of the bottom electrode;

performing a second soaking treatment on the bottom electrode using a second gas different from the first gas; and performing a second plasma treatment using the second gas to remove a second portion of the bottom electrode.

17. The method of claim 16, wherein the first gas comprises $N_2H_2$ and the second gas comprises HBr.

18. The method of claim 15, further comprising forming a barrier layer between the bottom electrode and the first dielectric layer, wherein forming the bottom electrode and the barrier layer comprises:

depositing a barrier material layer on the first dielectric layer, wherein the barrier material layer extends into the opening of the first dielectric layer to cover sidewalls and a bottom surface of the opening;

forming a bottom electrode material layer on the barrier material layer, wherein the bottom electrode material layer fills into the opening; and removing a portion of the barrier material layer and a portion of the bottom electrode material layer until the first dielectric layer is exposed, so as to form the barrier layer and the bottom electrode.

19. The method of claim 15, further comprising:

forming a hard mask layer on the top electrode; and patterning the hard mask layer, the top electrode, and the variable resistance layer to expose a portion of the first dielectric layer.

20. The method of claim 19, wherein the hard mask layer, the top electrode, and the variable resistance layer are patterned simultaneously through a same process.

* * * * *